United States Patent [19]

Tateishi

[11] Patent Number: 4,947,140

[45] Date of Patent: Aug. 7, 1990

[54] VOLTAGE CONTROLLED OSCILLATOR USING DIFFERENTIAL CMOS CIRCUIT

[75] Inventor: Hisao Tateishi, Tokyo, Japan

[73] Assignee: NEC Corporation, Tokyo, Japan

[21] Appl. No.: 415,689

[22] Filed: Oct. 2, 1989

[30] Foreign Application Priority Data

Sep. 30, 1988 [JP] Japan .................................. 63-246379

[51] Int. Cl.$^5$ ............................................. H03K 3/354
[52] U.S. Cl. ................................. 331/113 R; 331/144
[58] Field of Search .................... 331/113 R, 111, 144, 331/145

[56] References Cited

U.S. PATENT DOCUMENTS 3,857,110 12/1974 Grebene ...................... 331/113 R X
4,717,892 1/1988 Hitomi ............................ 331/113 R

OTHER PUBLICATIONS

Finvers et al., "Analysis of a Source—Coupled CMOS Multivibrator", "IEEE Transactions on Circuits and Systems", vol. 35, No. 9, Sep. 1988.

Primary Examiner—Siegfried H. Grimm
Attorney, Agent, or Firm—Sughrue, Mion, Zinn, Macpeak & Seas

[57] ABSTRACT

A voltage controlled oscillator comprises a differential circuit composed of first and second MOS transistors each having a drain connected to a gate of the other MOS transistor and each having a source connected to a constant current source, a capacitor connected to couple between the sources of the first and second MOS transistors, a first current mirror circuit having an input connected to the drain of the first MOS transistor and an output connected to the second MOS transistor, and a second current mirror circuit having an input connected to the drain of the second MOS transistor and an output connected to the first MOS transistor. A current value of the constant current sources is controlled to change an oscillation frequency.

5 Claims, 3 Drawing Sheets

VOLTAGE CONTROLLED OSCILLATOR USING DIFFERENTIAL CMOS CIRCUIT

BACKGROUND OF THE INVENTION

1. Field of the Invention

The present invention relates to a voltage controlled oscillator, and more specifically to a voltage controlled oscillator composed of complementary MOS transistors.

2. Description of Related Art

Voltage controlled oscillators (called "VCO" hereinafter) have been formed of complementary MOS transistors (called "CMOS" transistors) or bipolar transistors. In general, the VCO circuits for high frequency of 5 to 10 MHz have been formed of bipolar transistors. Recenty, VCO circuits have been developed which are formed of CMOS transistors oscillating at a high frequency.

However, the VCO circuits formed of CMOS transistors have been disadvantageous in that a center frequency of a high frequency oscillation varies widely, and in that a jitter easily occurs due to digital noises superimposed on a supply voltage.

Due to the above mentioned circumstances, conventional VCO circuits generating a high frequency oscillation have been composed of bipolar transistors, and therefore, it has been considered impossible to assemble a VCO circuit within an integrated circuit.

SUMMARY OF THE INVENTION

Accordingly, it is an object of the present invention to provide a VCO circuit which has overcome the above mentioned defect of the conventional one.

Another object of the present invention is to provide a VCO circuit which can generate a high frequency oscillation and which is composed of CMOS transistors so that the VCO circuit can be realized on an integrated circuit.

The above and other objects of the present invention are achieved in accordance with the present invention by a voltage controlled oscillator comprising a differential circuit composed of first and second MOS transistors each having a drain connected to a gate of the other MOS transistor and each having a source connected to a constant current source, a capacitor connected to couple between the sources of said first and second MOS transistors, a first current mirror circuit having an input connected to the drain of said first MOS transistor and an output connected to said second MOS transistor, and a second current mirror circuit having an input connected to the drain of said second MOS transistor and an output connected to said first MOS transistor, and a current value of said constant current sources being controlled to change an oscillation frequency.

In one embodiment of the VCO circuit in accordance with the present invention, the output of each of said first and second MOS transistors is fed back to the gate of the other MOS transistor through a source follower circuit.

With the above mentioned arrangement, the VCO circuit an accordance with the present invention is composed of CMOS transistors in such a manner that an on-off status inversion with reference to a threshold level is realized by a positive feedback amplifier loop of the differential circuit, differently from the conventional CMOS VCO circuit in which the status inversion is achieved by using a loop consisting of a number of gates. Therefore, since the VCO circuit in accordance with the present invention is composed of CMOS transistors, the VCO circuit in accordance with the present invention can be easily incorporated in an integrated circuit. In addition, since the VCO circuit in accordance with the present invention inverts the on-off condition by use of the positive feedback loop of the differential amplifier, the VCO circuit in accordance with the present invention can operate at a high frequency without being influenced by voltage supply noises.

The above and other objects, features and advantages of the present invention will be apparent from the following description of preferred embodiments of the invention with reference to the accompanying drawings.

DESCRIPTION OF THE PREFERRED EMBODIMENTS

Figure 1:
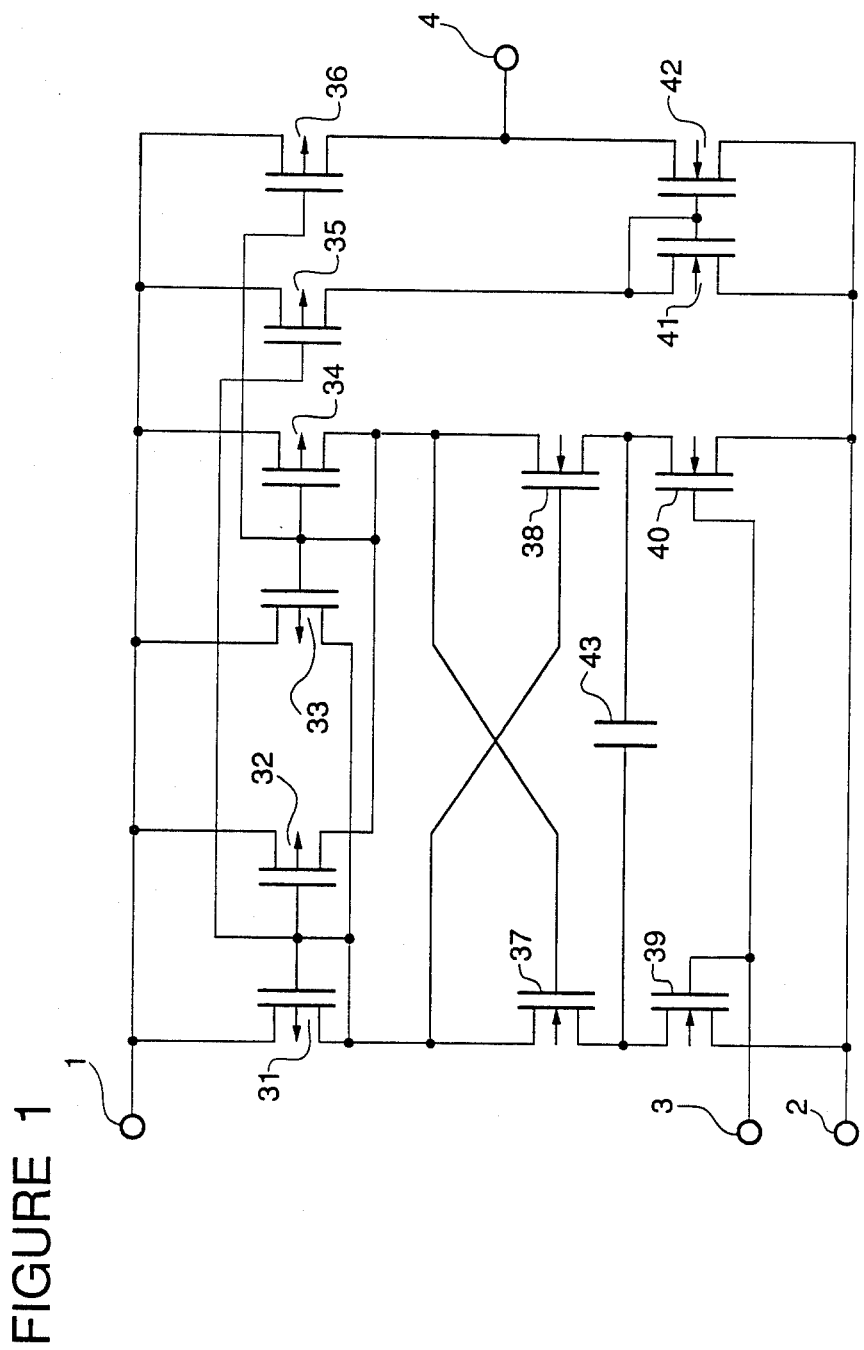
FIG. 1 is a circuit diagram of one embodiment of the CMOS VCO circuit in accordance with the present invention.

Referring to FIG. 1, there is shown a circuit diagram of the VCO circuit in accordance with the present invention.

The shown VCO circuit includes a terminal 1 to be connected to a positive voltage supply, another terminal 2 to be connected to a negative voltage supply, a control terminal 3 for receiving a control voltage explained hereinafter, and an output terminal 4.

The shown VCO circuit includes a differential circuit functioning as a positive feedback amplifier. This differential circuit is composed of a pair of NMOS transistors 37 and 38 each having a gate connected to a drain of the other transistor. Sources of the pair of NMOS transistors 37 and 38 are coupled to each other through a capacitor 43, and connected to constant current sources, respectively. Specifically, the source of the NMOS transistor 37 is connected to a drain of a NMOS transistor 39, whose source is grounded or connected to the negative voltage terminal 2. The source of the NMOS transistor 38 is connected to a drain of a NMOS transistor 40, whose source is grounded or connected to the negative voltage terminal 2. Gates of these NMOS transistors 39 and 40 are connected to the control terminal 3 so as to receive a control voltage.

Furthermore, the drain of the NMOS transistor 37 is connected to a drain and a gate of a PMOS transistor 31 having a source connected to the positive voltage terminal 1. In addition, the drain of the NMOS transistor 37 is connected to a gate of a PMOS transistor 32 having a source connected to the positive voltage terminal 1, and to a drain of a PMOS transistor 33 having a source connected to the positive voltage terminal 1. On the other hand, the drain of the NMOS transistor 38 is connected to a drain and a gate of a PMOS transistor 34 having a source connected to the positive voltage terminal 1. Further, the drain of the NMOS transistor 38 is connected to a gate of the PMOS transistor 33 and to a drain of the PMOS transistor 32. Namely, the PMOS transistor 31 forms a load for the NMOS transistor 37, and the PMOS transistor 34 forms a load for the NMOS transistor 38. In addition, the PMOS transistors 31 and 32 forms a current mirror circuit in which the PMOS transistor 31 functions an input current path and the PMOS transistor 32 functions an output current path. The PMOS transistors 33 and 34 form another current mirror circuit in which the PMOS transistor 34 functions an input current path and the PMOS transistor 33 functions an output current path.

In addition, the drains of the NMOS transistors 37 and 38 are connected to gates of a pair of PMOS transistors 35 and 36, respectively. Source of these PMOS transistors 35 and 36 are connected to the positive voltage terminal 1. A drain of the PMOS transistor 35 is connected to an input side of a current mirror circuit composed of a pair of NMOS transistors 41 and 42. Specifically, the drain of the PMOS transistor 35 is connected to a drain and a gaate of the NMOS transistor 41, which in turn has a source connected to the negative voltage terminal 2. A drain of the PMOS transistor 36 is connected to an output side of the current mirror circuit, namely to a drain of the NMOS transistor 42, which in turn has a gate connected to a drain and a gate of the NMOS transistor 41 and a source connected to the negative voltage terminal 2. A connection node between the PMOS transistor 36 and the NMOS transistor 42 is connected to the output terminal 4 as an output of the VCO circuit.

Figure 2:
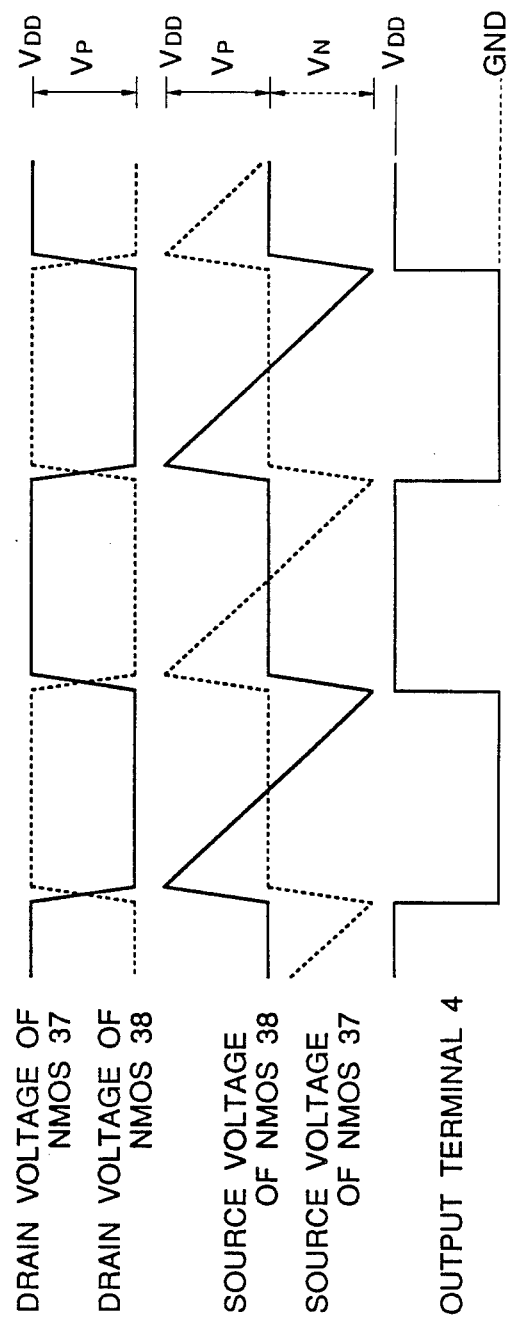
FIG. 2 is a waveform diagram illustrating voltage changes on various points in the CMOS VCO circuit shown in FIG. 1.

Now, the operation of the CMOS VCO circuit shown in FIG. 1 will be described with reference to FIG. 2 which shows a waveform diagram for illustrating an operation of the CMOS VCO circuit shown in FIG. 1.

When the NMOS transistors 37 is non-conductive and the NMOS transistor 38 is conductive, a drain current of the NMOS transistor 40 flows through the NMOS transistor 38. Therefore, a source potential of the NMOS transistor 38 is maintained at a level which is lower than the positive supply voltage $V_{DD}$ of the terminal 1 by a voltage $V_P$ explained hereinafter, and a drain potential of the NMOS transistor 38 is clamped in accordance with a square characteristics of the PMOS transistor 34.

On the other hand, since the NMOS transistor 37 is non-conductive, a drain current of the NMOS transistor 39 flows to discharge the capacitor 43, so that the source potential of the NMOS transistor 37 will gradually go lower. When the source potential of the NMOS transistor 37 attains a voltage turning on the NMOS transistor 37, namely a voltage lower than $V_{DD}$ by $(V_P+V_N)$ ($V_P$ and $V_N$ will be described hereinafter), since NMOS transisitors 37 and 38 form the positive feedback amplifier as mentioned above, the on-off conditions of the NMOS transistor 37 and 38 are instantaneously inverted to the effect that the NMOS transistor 37 is turned on and the NMOS transistor 38 is turned off. Due to this rapid inversion of the on-off condition, the source potential of the NMOS transistor 37 is rapidly elevated to $V_{DD}-V_P$, and therefore, the capacitor 43 has not substantially been discharged. Accordingly, the source potential of the NMOS transistor 38 is elevated by a voltage corresponding to the elevation of the source potential of the NMOS transistor 37 by action of a remaining charge stored in the capacitor.

When the NMOS transistors 38 is non-conductive and the MNOS transistor 37 is conductive, the drain current of the NMOS transistor 39 flows through the NMOS transistor 37. Therefore, the source potential of the NMOS transistor 37 is clamped at a level which is lower than the positive supply voltage $V_{DD}$ of the terminal 1 by the voltage $V_P$, and the drain potential of the MNOS transistor 37 is clamped in accordance with a square characteristics of the PMOS transistor 31.

On the other hand, since the NMOS transistor 38 is non-conductive, the drain current of the NMOS transistor 40 flows to discharge the capacitor 43, so that the source potential of the NMOS transistor 38 will gradually go lower. When the source potential of the NMOS transistor 38 attains a voltage turning on the NMOS transistor 38, namely a voltage lower than $V_{DD}$ by $(V_P+V_N)$, the on-off conditions of the NMOS transistors 37 and 38 are instantaneously inverted to the effect that the NMOS transistor 38 is turned on and the PMOS transistor 37 is turned off, since NMOS transistors 37 and 38 form the positive feedback amplifier as mentioned above.

Due to this rapid inversion of the on-off conditions, the source potential of the NMOS transistor 38 is rapidly elevated to $V_{DD}-V_P$, and therefore, since the capacitor 43 has not substantially been discharged, the source potential of the NMOS transistor 37 is elevated by a voltage corresponding to the elevation of the source potential of the NMOS transistor 38 by action of a remaining charge stored in the capacitor.

The above mentioned operation is repeated so that the VCO circuit maintains its oscillation condition.

Here, $V_P$ and $V_N$ are defined as follows:

$$V_P = V_{TP} + (2 \times I_O/\beta_P)^{\frac{1}{2}}$$

$$V_N = V_{TN} + (2 \times I_O/\beta_N)^{\frac{1}{2}}$$

Where
$\beta_P = K_P \times (W_P/L_P)$
$\beta_N = K_N \times (W_N/L_N)$
$I_O$ is a constant current value of the NMOS transistor 39 (or the NMOS transistor 40)
$K_P$ and $K_N$ are [mobility] $\times$ [unitary gate capacitance] of PMOS and NMOS transistors, respectively
$W_P$ and $L_P$ are a gate width and a gate length of PMOS transistors 31, 32, 33 and 34, respectively.
$W_N$ and $L_N$ are a gate width and a gate length of NMOS transistors 37 and 38, respectively
$V_{TP}$ is a threshold voltage of PMOS transistors
$V_{TN}$ is a threshold voltage of NMOS transistors Here, in the positive feedback amplifier composed of NMOS transistors 37 and 38, a load for the NMOS transistor 37 includes the PMOS transistor 31 having the square characteristics and the PMOS transistor 33 acting as an active load. On the other hand, a load for the NMOS transistor 38 includes the PMOS transistor 34 having the square characteristics and the PMOS transistor 32 acting as an active load. Therefore, the drain voltages of the NMOS transistors 37 and 38 are clamped in accordance with the square characteristics of the PMOS transistors 31 and 33, respectively, and on the other hand, a high gain is attained by the active loads of the PMOS transistors 32 and 33, respectively. In addition, these transistors can be realized with a relatively small area in the mask layout.

Furthermore, the oscillation frequency of this VCO circuit is given as follows:

$$f_{osc} = I_O/(2 \times (V_P + V_N) \times C_{43})$$

where $I_O$ is a drain current of the NMOS transistors 39 and 40

$C_{43}$ is a capacitance of the capacitor 43

Furthermore, since the inversion of the on-off condition is effected by utilizing the positive feedback of the differential amplifier having a common mode rejection ratio which is ten to thirty times as large as that of a single drive transistor circuit such as an inverter, the VCO circuit can stably oscillate with less jitter due to the supply voltage superimposed with digital noises, in comparison with the conventional CMOS VCO circuit.

In addition, since the on-off condition is inverted by the positive feedback of the differential amplifier, the speed of the inversion is very high, and therefore, the VCO circuit can generate an oscillation frequency of several tens MHz.

Figure 3:
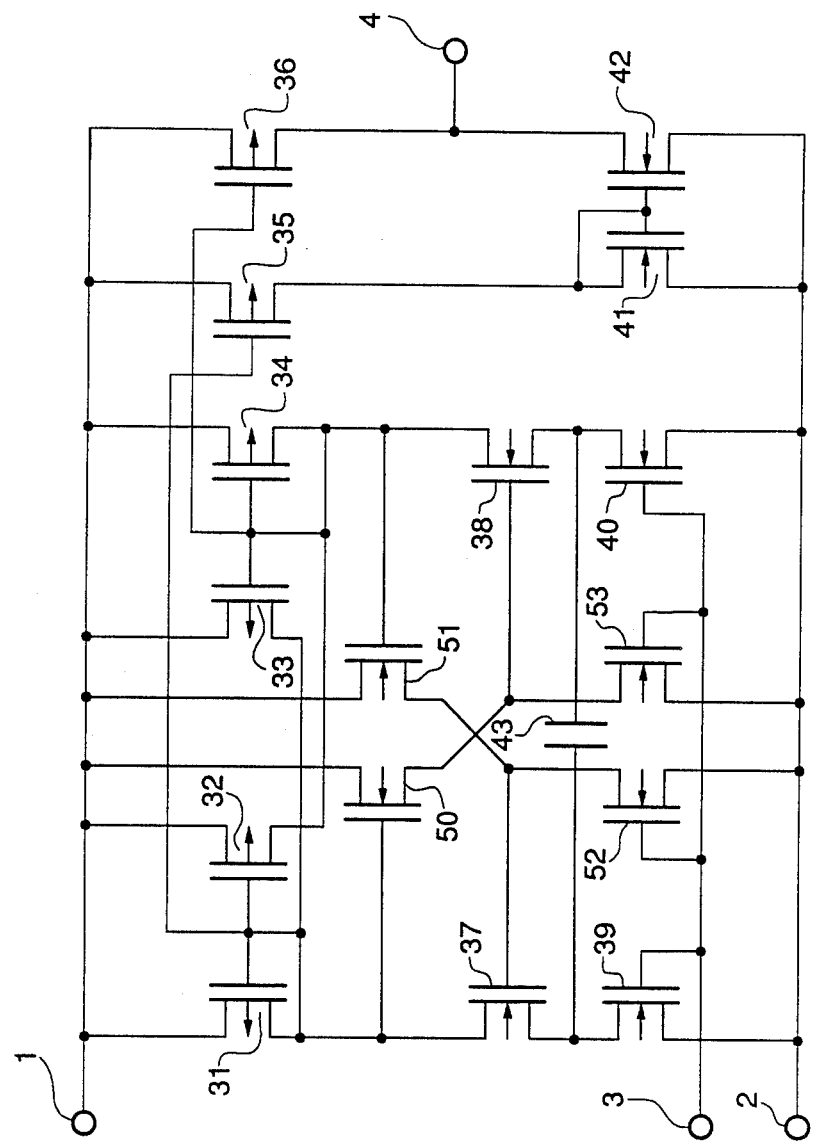
FIG. 3 is a circuit diagram of another embodiment of the CMOS VCO circuit in accordance with the present invention.

Referring to FIG. 3, there is shown another embodiment of the VCO circuit in accordance with the present invention. In FIG. 3, elements similar or corresponding to those shown in FIG. 1 are given the same Reference Numerals, and explanation thereof will be omitted.

As seen from comparison between FIGS. 1 and 3, the drain output of each transistor in the differential circuit is positively fed back to the drain of the other transistor through a source follower. Namely, the drain of the NMOS transistor 37 is connected to a gate of an NMOS transistor 50 having a drain connected to the positive voltage terminal 1 and a source connected to the negative voltage terminal 2 through a constant current source which is formed of an NMOS transistor 53 whose gate is connected to the control terminal 3. A node between the source of the NMOS transistor 50 and the drain of the NMOS transistor 53 is connected to the gate of the NMOS transistor 38. On the other hand, the drain of the NMOS transistor 38 is connected to a gate of an NMOS transistor 51 having a drain connected to the positive voltage terminal 1 and a source connected to the negative voltage terminal 2 through another constant current source which is formed of an NMOS transistor 52 whose gate is connected to the control terminal 3. A node between the source of the NMOS transistor 51 and the drain of the NMOS transistor 52 is connected to the gate of the NMOS transistor 37.

The oscillation frequency of this VCO circuit is given as follows:

$$f_{osc} = I_O / (2 \times (V_P + 2 \times V_N) \times C_{43})$$

Since the VCO circuit shown in FIG. 3 is different from the VCO circuit shown in FIG. 1 only in the point in which the source follower is provided in each positive feedback path as mentioned above, it will be understood that the VCO circuit of FIG. 3 operates basically similarly to the VCO circuit of FIG. 1.

In addition, with addition of the source follower circuit, the drain-source voltage of the differential amplifier is ensured. As a result, the transistors are prevented from being saturated at the time of the switching operation, and even when the inputs of the differential amplifier are balanced to each other, the gain is not lowered. Therefore, the VCO circuit shown in FIG. 3 can switch at a speed higher than that of the VCO circuit shown in FIG. 1.

The invention has thus been shown and described with reference to the specific embodiments. However, it should be noted that the present invention is in no way limited to the details of the illustrated structures but changes and modifications may be made within the scope of the appended claims.

I claim:

1. A voltage controlled oscillator comprising a differential circuit composed of first and second MOS transistors each having a drain connected to a gate of the other MOS transistor and each having a source connected to a constant current source, a capacitor connected to couple between the sources of said first and second MOS transistors, a first current mirror circuit having an input connected to the drain of said first MOS transistor and an output connected to said second MOS transistor, and a second current mirror circuit having an input connected to the drain of said second MOS transistor and an output connected to said first MOS transistor, and a current value of said current sources being controlled to change an oscillation frequency.

2. A circuit claimed in claim 1 wherein the output of each of said first and second MOS transistor is fed back to the gate of the other MOS transistor through a source follower circuit.

3. A circuit claimed in claim 1 wherein said constant current source connected to the source of each of said first and second MOS transistors is composed of a MOS transistor having a drain connected to the source of a corresponding one of said first and second MOS transistors and a gate connected to receive a control voltage.

4. A circuit claimed in claim 1 wherein said first current mirror circuit has a third MOS transistor having a gate and a drain connected to the drain of said first MOS transistor and a source connected to a voltage supply, and a fourth MOS transistor having a gate connected to the gate of said third MOS transistor, a drain connected to the drain of said second MOS transistor and a source connected to said voltage supply, and said second current mirror circuit has a fifth MOS transistor having a gate and a drain connected to the drain of said second MOS transistor and a source connected to said voltage supply, and a sixth MOS transistor having a gate connected to the gate of said fifth MOS transistor, a drain connected to the drain of the said first MOS transistor and a source connected to said voltage supply.

5. A circuit claimed in claim 1 further including an output circuit which comprises a third MOS transistor having a source connected to a high voltage supply and a gate connected to the drain of said first MOS transistor, a fourth MOS transistor having a source connecting to said high voltage supply and a gate connected to the drain of said second MOS transistor, a fifth MOS transistor having a source connected to a low voltage supply and a gate and a drain connected to the drain of said third MOS transistor, and a sixth MOS transistor having a source connected to said low voltage supply, a gate connected to the gate of said fifth MOS transistor, and a drain connected to the drain of said fourth MOS transistor, a connection node between fourth and sixth MOS transistors being connected to an output of the voltage controlled oscillator.

* * * * *

UNITED STATES PATENT AND TRADEMARK OFFICE
CERTIFICATE OF CORRECTION

PATENT NO. : 4,947,140
DATED : August 7, 1990
INVENTOR(S) : Hisao Tateishi

It is certified that error appears in the above-identified patent and that said Letters Patent is hereby corrected as shown below:

Col. 1, line 17, delete "Recenty" and insert --Recently--.

Col. 4, line 33, delete "$(2xI_0/\beta P)^{\frac{1}{2}}$" and insert --$(2xI_0/\beta P)^{\frac{1}{2}}$--.

Col. 4, line 35, delete "$(2xI_0/\beta N)^{\frac{1}{2}}$" and insert --$(2xI_0/\beta N)^{\frac{1}{2}}$--.

Signed and Sealed this

Thirty-first Day of March, 1992

Attest:

HARRY F. MANBECK, JR.

*Attesting Officer*  *Commissioner of Patents and Trademarks*